United States Patent
Matsumura et al.

(10) Patent No.: US 7,350,685 B2
(45) Date of Patent: Apr. 1, 2008

(54) METHOD OF MOUNTING ELECTRONIC COMPONENT

(75) Inventors: Takayoshi Matsumura, Kawasaki (JP); Hidehiko Kira, Kawasaki (JP); Kenji Kobae, Kawasaki (JP); Norio Kainuma, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 159 days.

(21) Appl. No.: 11/041,301

(22) Filed: Jan. 25, 2005

(65) Prior Publication Data

US 2006/0091185 A1    May 4, 2006

(30) Foreign Application Priority Data

Oct. 29, 2004    (JP)    ............... 2004-316511

(51) Int. Cl.
*B23K 1/06* (2006.01)
(52) U.S. Cl. .................... 228/110.1; 228/1.1
(58) Field of Classification Search ............... 228/1.1, 228/110.1
See application file for complete search history.

(56) References Cited

U.S. PATENT DOCUMENTS

| | | | |
|---|---|---|---|
| 6,247,628 B1 * | 6/2001 | Sato et al. ............... | 228/1.1 |
| 6,482,279 B2 * | 11/2002 | Nakano et al. ............ | 156/73.1 |
| 6,494,976 B1 * | 12/2002 | Hayashi et al. ............ | 156/73.1 |
| 6,811,630 B2 * | 11/2004 | Tominaga et al. ......... | 156/73.1 |
| 7,017,791 B2 * | 3/2006 | Higashiyama ............. | 228/1.1 |
| 7,150,388 B2 * | 12/2006 | Matsumura ............... | 228/110.1 |
| 2003/0057537 A1 | 3/2003 | Iwasaki et al. | |

FOREIGN PATENT DOCUMENTS

| | | |
|---|---|---|
| JP | 2002-313834 | 10/2002 |
| JP | 2003-100803 | 4/2003 |

* cited by examiner

*Primary Examiner*—Kiley Stoner
(74) *Attorney, Agent, or Firm*—Arent Fox LLP

(57) ABSTRACT

The method is capable of securely mounting an electronic component on a circuit board by applying ultrasonic vibration. The method comprises the step of applying ultrasonic vibrations to the electronic component so as to flip-chip-bond the electronic component to the circuit board having electrodes. Portions of the circuit board, which correspond to peaks of amplitude of vibrations transmitted to the circuit board, are pressed when the ultrasonic vibrations are applied to the electronic component.

7 Claims, 3 Drawing Sheets

METHOD OF MOUNTING ELECTRONIC COMPONENT

BACKGROUND OF THE INVENTION

The present invention relates to a method of mounting an electronic component by applying ultrasonic vibrations.

When a semiconductor chip, which is an example of the electronic component, is mounted on a circuit board by flip chip bonding, bumps of the semiconductor chip are headed for the circuit board, then the bumps, which are made of gold or solder, are respectively bonded to electrodes of the circuit board. A space between the semiconductor chip and the circuit board is filled with synthetic resin so as to protect a circuit face of the semiconductor chip, prevent the bumps from corrosion and improve bonding strength therebetween.

When the semiconductor chip is flip-chip-bonded to the circuit board by applying ultrasonic vibrations, the circuit board is sucked and fixed to a supporting table so as not to displace the circuit board. However, it is very difficult to completely fix the circuit board to the supporting table, so ultrasonic vibrations are transmitted from the semiconductor to the circuit board when a load and ultrasonic vibrations are applied to the semiconductor chip. If the circuit board too is vibrated, relative motion or friction between the semiconductor chip and the circuit board is made small, so that poor bonding therebetween occurs.

SUMMARY OF THE INVENTION

The present invention has been invented to solve the problems of poor bonding.

An object of the present invention is to provide a method of mounting an electronic component, which is capable of securely mounting the electronic component on a circuit board by applying ultrasonic vibrations.

To achieve the object, the present invention has following methods.

Namely, the basic method of the present invention comprises the step of: applying ultrasonic vibrations to an electronic component so as to flip-chip-bond the electronic component to a circuit board having electrodes, wherein portions of the circuit board, which correspond to peaks of amplitude of vibrations transmitted to the circuit board, are pressed when the ultrasonic vibrations are applied to the electronic component. Note that, in case that the electronic component has lines of bumps, the positions of the bumps are not limited to specific positions which correspond to the peaks of amplitude of the ultrasonic vibrations.

In the method, the portions of the circuit board to be pressed may be located on an outer side of a mounting area, in which the electronic component is mounted, in a direction parallel to a direction of the ultrasonic vibrations.

In the method, the portions of the circuit board to be pressed may be located on an outer side of a mounting area, in which the electronic component is mounted, and the portions may correspond to lines of bumps of the electronic component, which may be separated in a direction parallel to a direction of the ultrasonic vibrations.

In the method, the portions of the circuit board to be pressed may be located on an outer side of a mounting area, in which the electronic component is mounted, and the portions may be located on an inner side with respect to lines of bumps of the electronic component, which are separated in a direction parallel to a direction of the ultrasonic vibrations.

In the method, ends of the circuit board, which are separated in a direction parallel to a direction of the ultrasonic vibrations, may be fixed when the circuit board is pressed.

In the method, the circuit board may be pressed onto a supporting stage by a jig. With this method, vibration of the circuit board can be restrained, so that the electronic component can be securely mounted.

In the method, the peaks of amplitude of the ultrasonic vibrations may correspond to bumps of the electronic component when the ultrasonic vibrations are applied to the electronic component. With this method, amplitude of the ultrasonic vibrations reach the peaks at the bumps, so that the electronic component can be securely mounted on the circuit board. Further, vibration of the circuit board can be restrained, so that the electronic component can be securely mounted.

By using the method of the present invention, the vibration of the circuit board can be effectively restrained when the electronic component is mounted on the circuit board, so that the electronic component can be securely mounted thereon.

BRIEF DESCRIPTION OF THE DRAWINGS

Embodiments of the present invention will now be described by way of examples and with reference to the accompanying drawings, in which.

DETAILED DESCRIPTION OF THE EMBODIMENTS

Preferred embodiments of the present invention will now be described in detail with reference to the accompanying drawings.

Figure 1:
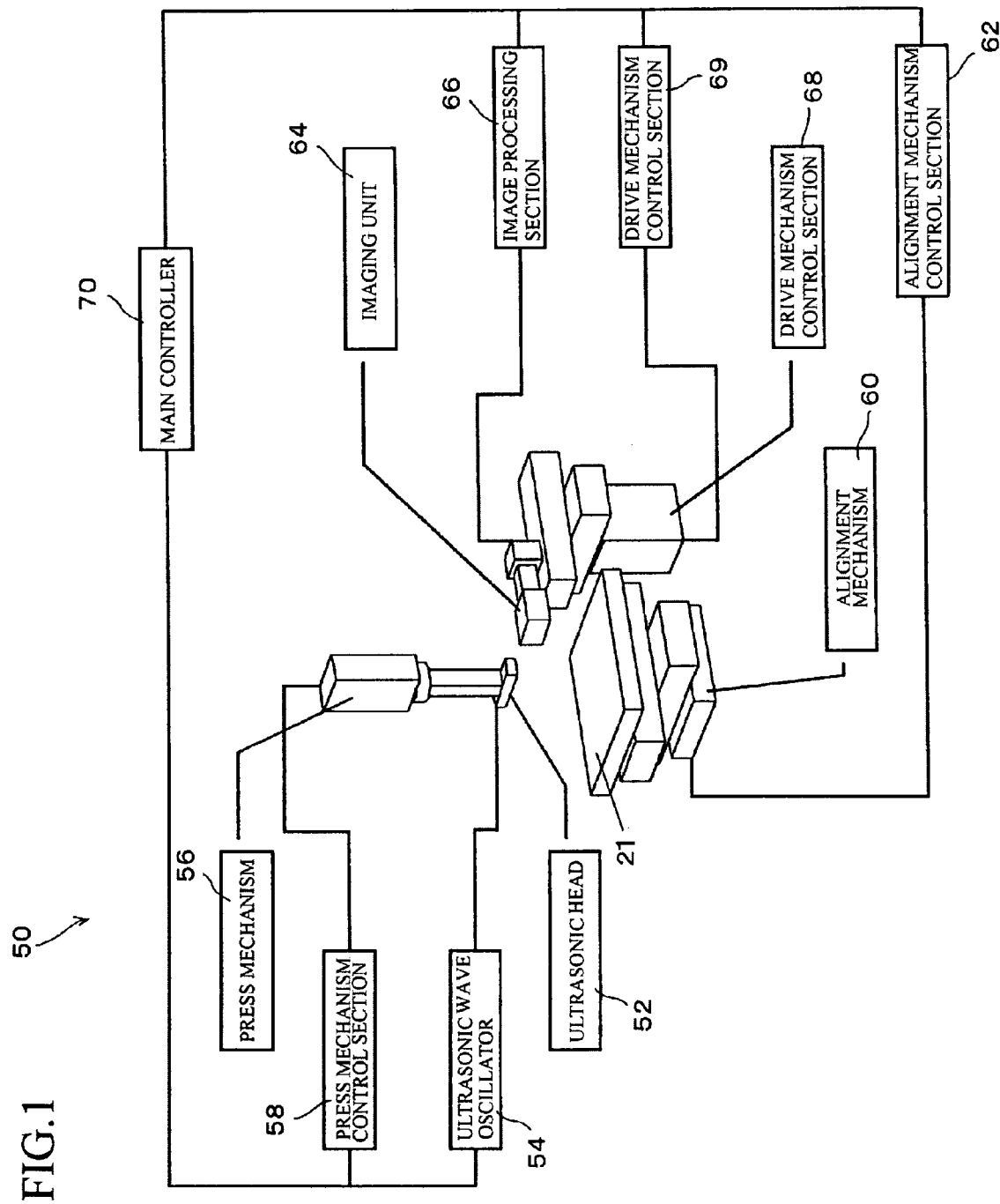
FIG. 1 is an explanation view of a mounting machine for flip-chip-bonding a semiconductor chip by the method of the present invention.

FIG. 1 shows a mounting machine 50 for flip-chip-bonding a semiconductor chip 10, which is an example of the electronic component, onto a circuit board 20.

The mounting machine 50 mainly comprises a ultrasonic head side and a supporting table side. The ultrasonic head side includes: a ultrasonic head 52 air-sucking and holding the semiconductor chip 10; a ultrasonic wave oscillator 54 applying ultrasonic vibrations to the ultrasonic head 52; a press mechanism 56 pressing the semiconductor chip 10 toward the circuit board 10; and a press mechanism control section 58 controlling a load of the press mechanism 56.

On the other hand, the supporting table side includes: an alignment mechanism 60 positioning and moving a supporting table 21 in X- Y- and θ-directions; and an alignment mechanism control section 62 controlling the alignment mechanism 60 so as to adjust mutual positions of the semiconductor chip 10 and the circuit board 20 and correctly flip-chip-bond the semiconductor chip 10 to the circuit board 20. Further, the supporting table side includes: an imaging unit 64, which acts as a detecting mechanism, detecting the mutual positions of the semiconductor chip 10 and the circuit board 20; an image processing section 66 processing image data sent from the imaging unit 64; a drive mechanism 68 moving the imaging unit 64; and a drive mechanism control section 69 controlling the drive mechanism 68 so as to move the imaging unit 64 to a prescribed position.

A main controller 70 controls the alignment mechanism control section 62, on the basis of results detected by the image processing section 66, so as to correctly position the semiconductor chip 10 and the circuit board 20. Then, the main controller 70 controls the press mechanism control section 58 and the ultrasonic wave oscillator 54, so that the semiconductor chip 10 can be flip-chip-bonded or mounted on the circuit board 20 with a suitable load.

First Embodiment

A first embodiment of the method will be explained with reference to FIGS. 2A and 2B. When the semiconductor chip 10 is flip-chip-bonded to the circuit board 20 by applying ultrasonic vibrations, a lower face of the semiconductor chip 10, in which bumps 12 are formed, is headed for the circuit board 20, and the bumps 12 are respectively correspond to electrodes 22 of the circuit board 20. Then, the semiconductor chip 10, to which ultrasonic vibrations are applied, is pressed onto the circuit board 20 so as to bond the semiconductor chip 10 to the circuit board 20.

The ultrasonic head 52 of the machine 50 shown in FIG. 1 has an air-sucking mechanism for sucking and holding the semiconductor chip 10. A rear face of the semiconductor chip 10 is sucked by the air-sucking mechanism. The alignment mechanism 60 has a supporting stage, which sucks and holds the circuit board 20, and correspond the circuit board 20 to the semiconductor chip 10, so that the semiconductor chip 10 can be correctly flip-chip-bonded to the circuit board 20.

In the present embodiment, the problem of sympathetically vibrating the circuit board 20 with the semiconductor chip 10, which occurs when ultrasonic vibrations are applied to the semiconductor chip 10, can be solved by downwardly pressing an upper face of the circuit board 20 with jigs 30.

Figure 2A:
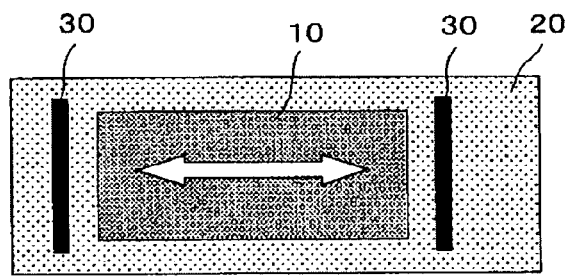
FIGS. 2A and 2B are explanation views showing a first embodiment of the method of the present invention.

FIG. 2A is a plan view, in which the semiconductor chip 10 is provided on the upper face of the circuit board 20 and ultrasonic vibrations are applied in the direction of an arrow so as to bond the semiconductor chip 10 to the circuit board 20. Namely, the direction of the arrow is the direction of the ultrasonic vibrations. In the present embodiment, a pair of the jigs 30, which press the circuit board 20, are respectively located on both outer sides of the semiconductor chip 10 in the direction of the ultrasonic vibrations.

Figure 2B:
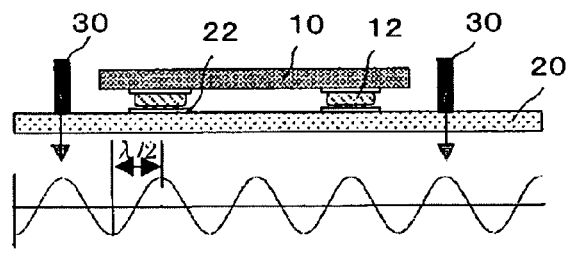

FIG. 2B is a front view, in which the semiconductor chip 10 is bonded to the circuit board 20 by applying ultrasonic vibrations to the semiconductor chip 10. The bumps 10 of the semiconductor chip 10 are respectively corresponded to the electrodes 22 of the circuit board 20, and the circuit board 20 is pressed downward by the jigs 30 so that the semiconductor chip 10 can be mounted on the circuit board 20. The circuit board 20 is supported by the supporting stage 21 (not shown in FIG. 1).

A waveform chart of vibrations of the circuit board 20, which is vibrated by applying ultrasonic vibrations to the semiconductor chip 10, is also shown in FIG. 2B. When the semiconductor chip 10 is bonded to the circuit board 20 by applying ultrasonic vibrations, it is effective to make amplitude of the waveform great at positions of the bumps 12 and the electrodes 12. Namely, mutual friction between the bumps 12 and the electrodes 12 is made great. Namely, the vibrations are controlled to make the mutual friction between the bumps 12 and the electrodes 12 great. As shown in FIG. 2B, the positions of the bumps 12 and the electrodes 12 correspond to peaks of amplitude of the vibrations of the circuit board.

In the case of applying ultrasonic vibrations to the semiconductor chip 10, the most effective manner for restraining vibrations of the circuit board 20 is to press the positions of the circuit board 20, which correspond to the peaks of amplitude of the vibrations transmitted to the circuit board 20, by the jigs 30.

In FIGS. 2A and 2B, the jigs 30 press the portions of the circuit board 20, which correspond to the peaks of amplitude of vibrations, and they are located on the outer sides of the semiconductor chip 10, in a direction parallel to the direction of the ultrasonic vibrations.

Since the jigs 30 press the portions corresponding to the peaks of amplitude of the ultrasonic vibrations, pressing forces of the jigs 30 may be concentrated to the positions, at which the amplitude of the ultrasonic vibrations are maximized. Therefore, in the present embodiment, the jigs 30 are made of plate-shaped members, which are capable of pressing the portions corresponding to the peaks of amplitude of the ultrasonic vibrations. As shown in FIG. 2B, longitudinal directions of the jigs 30 are perpendicular to the direction of the ultrasonic vibrations, and the jigs 30, whose length are equal to or slightly longer than a width of the semiconductor chip 10, press the portions corresponding to the peaks of amplitude of the ultrasonic vibrations.

To restrain vibrations of the circuit board 20, a surface of the circuit board may be partially pressed by the plate-shaped jigs 30. However, if the jigs are wide plates, they press the circuit board unevenly. In the present embodiment, the jigs 30 are thin plates, so that the circuit board 20 can be securely evenly pressed by the jigs 30.

The positions corresponding to the peaks of the ultrasonic vibrations transmitted to the circuit board 20 are varied by varying frequency of the ultrasonic vibrations applied to the semiconductor chip 10. Therefore, the positions to be pressed by the jigs 30 may be adjusted on the basis of the frequency of the ultrasonic vibrations. The peaks of amplitude of the ultrasonic vibrations appears at regular intervals of $2/\lambda$ ($\lambda$ is a wave length of the ultrasonic vibrations), so the jigs 30 are positioned on the basis of the peaks. Note that, the jigs 30 may be positioned at the positions corresponding to maximum peaks or minimum peaks.

In the present embodiment, the jigs 30 press the circuit board 20 at the positions corresponding to the peaks of the ultrasonic vibrations applied to the semiconductor chip 10, so that vibrations of the circuit board 20 can be effectively restrained. By restraining the sympathetic vibrations of the circuit board 20, ultrasonic vibrations can effectively work to the semiconductor chip 10 and the circuit board 20, so that the semiconductor chip 10 can be securely bonded to the circuit board 20.

Note that, in FIGS. 2A and 2B, two lines of the bumps 12 are formed along two opposite edges of the semiconductor chip 10, but the method may be applied to other semiconductor chips. For example, in case of a semiconductor chip having four lines of the bumps formed along four edges, opposite two lines of four may be corresponded to the peaks of the ultrasonic vibrations, and the circuit board may be pressed by, for example, the jigs 30 as well as the manner shown in FIGS. 2A and 2B.

Second Embodiment

A second embodiment of the method will be explained with reference to FIGS. 3A and 3B. The feature of the present embodiment is to press portions of the circuit board 20, which correspond to the bumps 12 of the semiconductor chip 10, by jigs 31.

As described above, when the semiconductor chip 10 is flip-chip-bonded to the circuit board 20 by applying ultrasonic vibrations, it is effective to position the bumps 12 of the semiconductor chip 10 and the electrodes 22 of the circuit board 20 correspond to the peaks of amplitude of the ultrasonic vibrations.

Therefore, when the circuit board 20 is pressed by the jigs 31, the jigs 31 is corresponded to the bumps 12 of the semiconductor chip 10, so that vibrations of the circuit board 20 can be effectively restrained and the semiconductor chip 10 can be securely mounted.

Figure 3A:
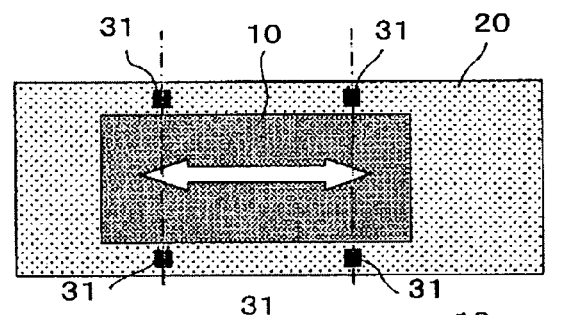
FIGS. 3A and 3B are explanation views showing a second embodiment of the method of the present invention.
Figure 3B:
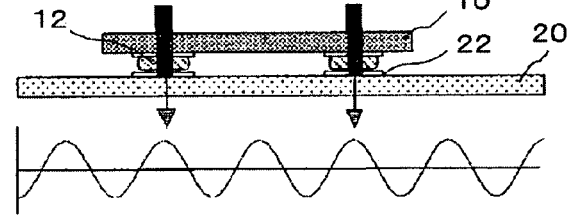

FIG. 3A is a plan view, in which the circuit board 20 is pressed by the jigs 30 and ultrasonic vibrations are applied to the semiconductor chip 10 so as to mount the semiconductor chip 10 on the circuit board 20. The jigs 31 are located on the upper surface of the circuit board 20 and along one-dot chain lines outwardly extended from the lines of the bumps 12. With this arrangement, the jigs 31 never interferes with the semiconductor chip 10. Two pairs of the jigs 31 are provided on the opposite sides of the semiconductor chip 10. In the present embodiment, the jigs 31 are thin rods, so that even small or narrow portions of the circuit board 20 can be pressed.

In the present embodiment, the jigs 31 are provided along the one-dot chain lines outwardly extended from the lines of the bumps 12, which are arranged perpendicular to the direction of the ultrasonic vibrations (the arrow), and the circuit board 20 is pressed by the jigs 31. With this structure, vibrations of the circuit board 20 can be effectively restrained, so that the semiconductor chip 10 can be securely mounted on the circuit board 20.

Third Embodiment

Figure 4A:
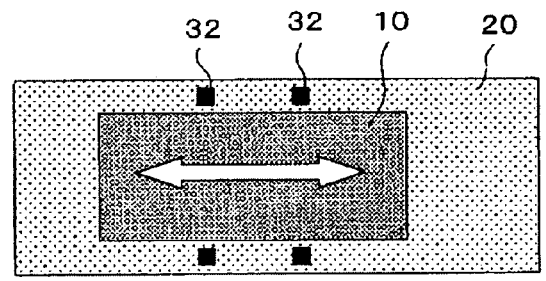
FIGS. 4A and 4B are explanation views showing a third embodiment of the method of the present invention.

A third embodiment of the method will be explained with reference to FIGS. 4A and 4B. In the present embodiment too, jigs 32 for pressing the circuit board 20 are provided to positions corresponding to the peaks of amplitude of the ultrasonic vibrations applied to the semiconductor chip 10, and the jigs 32 press the circuit board 20 while the semiconductor chip 10 is mounted by applying ultrasonic vibrations.

Figure 4B:
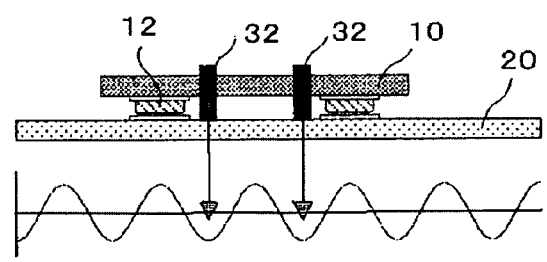

Two pairs of the jigs 32, each pair of which are separately arranged in a direction perpendicular to the direction of the ultrasonic vibration (the arrow), are located on inner sides with respect to the lines of bumps 12 (see FIG. 4B).

The jigs 32, which are located on the inner sides with respect to the lines of bumps 12, correspond to the peaks of amplitude of the ultrasonic vibrations. Further, two pairs of the jigs 32, each pair of which are separately arranged in the direction parallel to the direction of the ultrasonic vibrations (the arrow), are provided on the opposite sides of the semiconductor chip 10 (see FIG. 4A). Note that, in the present embodiment, the jigs 32 correspond to the bottom peaks of amplitude of the ultrasonic vibrations.

Fourth Embodiment

Figure 5A:
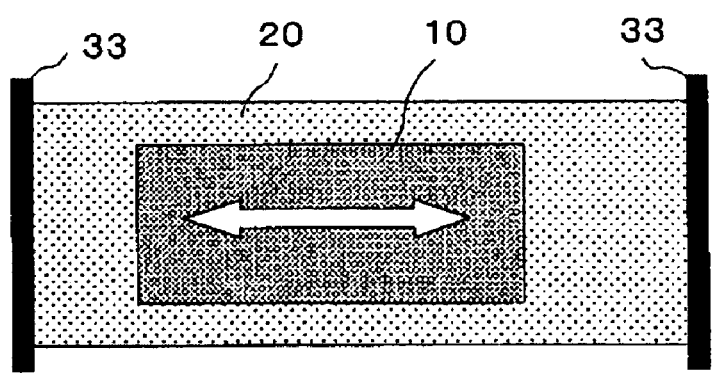
FIGS. 5A and 5B are explanation views showing a fourth embodiment of the method of the present invention.
Figure 5B:
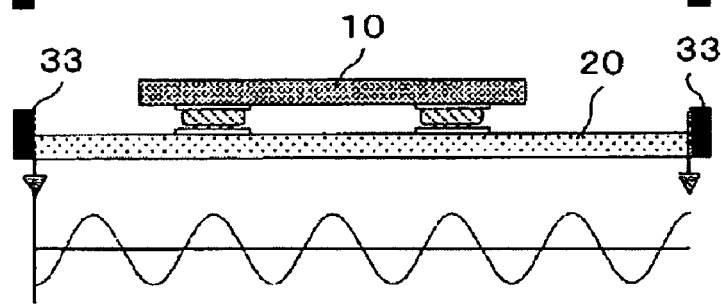

A fourth embodiment of the method will be explained with reference to FIGS. 5A and 5B. In the present embodiment, ends of the circuit board 20, which are separated in a direction parallel to the direction of the ultrasonic vibrations (the arrow), are fixed and pressed by jigs 33 when the semiconductor chip 10 is mounted on the circuit board 20 by applying ultrasonic vibrations.

When the semiconductor chip 10 is mounted on the circuit board 20 by applying ultrasonic vibrations to the semiconductor chip 10, if the circuit board 20 is vibrated, both ends of the circuit board 20 in the direction of the ultrasonic vibrations (the arrow) inevitably correspond to the peaks of amplitude of the ultrasonic vibrations. By fixing the both ends of the circuit board 20 by the jigs 33, the vibrations of the circuit board 20 can be effectively restrained.

The both ends of the circuit board 20 may be fixed by any manners. For example, the circuit board 20 is clamped from the both sides by a pair of the jigs 33, then the jigs 33 are biased inward so that the circuit board 20 can be fixed. Further, the jigs 33 may press the end edges of the circuit board 33 onto the supporting table so that the circuit board 20 can be fixed.

By pressing the both ends of the circuit board 20 with the jigs 33, the both ends of the circuit board 20, which correspond to the peaks of the ultrasonic vibrations, are fixed, so that the vibrations of the circuit board 20 can be effectively restrained. Thus, the semiconductor chip 10 can be securely mounted onto the circuit board 20. In the former embodiments, the press positions corresponding to the peaks must be checked. On the other hand, in the present embodiment, the both ends of the circuit board 20 are merely pressed by the jigs 33. Namely, the step of checking the press positions can be omitted. Therefore, the semiconductor chip 10 can be easily and efficiently mounted.

When the semiconductor chip 10 is mounted on the circuit board 20 by applying ultrasonic vibrations, if the press positions are incorrect, sympathetic vibrations of the circuit board 20 are sometimes amplified. However, in the method of the present invention, the sympathetic vibrations of the circuit board 20 can be effectively restrained by correctly pressing the circuit board 20, so that the semiconductor 10 can be securely mounted thereon.

Further, a plurality of kinds of jigs for pressing the circuit board may be combined.

Note that, the method of the present invention can be applied to not only semiconductor chips but also other electronic components, which are mounted on substrates by applying ultrasonic vibrations.

The invention may be embodied in other specific forms without departing from the spirit of essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A method of mounting an electronic component on a circuit board comprising the step of:

applying ultrasonic vibrations to the electronic component so as to flip-chip-bond the electronic component to the circuit board having electrodes, and pressing portions of the circuit board directly by a jig while applying the ultrasonic vibrations to the electronic component, the pressing portions corresponding to peaks of amplitude of vibrations transmitted to the circuit board.

2. The method according to claim 1,
wherein the portions of the circuit board to be pressed are located on an outer side of a mounting area, in which the electronic component is mounted, in a direction parallel to a direction of the ultrasonic vibrations.

3. The method according to claim 1,
wherein the portions of the circuit board to be pressed are located on an outer side of a mounting area, in which the electronic component is mounted, and
said portions correspond to lines of bumps of the electronic component, which are separated in a direction parallel to a direction of the ultrasonic vibrations.

4. The method according to claim 1,
wherein the portions of the circuit board to be pressed are located on an outer side of a mounting area, in which the electronic component is mounted, and
said portions are located on an inner side with respect to lines of bumps of the electronic component, which are separated in a direction parallel to a direction of the ultrasonic vibrations.

5. The method according to claim 1,
wherein ends of the circuit board, which are separated in a direction parallel to a direction of the ultrasonic vibrations, are fixed when the circuit board is pressed.

6. The method according to claim 1,
wherein the circuit board is pressed onto a supporting stage by a jig.

7. The method according to claim 1,
wherein the peaks of amplitude of the ultrasonic vibrations correspond to bumps of the electronic component when the ultrasonic vibrations are applied to the electronic component.

* * * * *